US006304608B1

(12) United States Patent
Chen et al.

(10) Patent No.: US 6,304,608 B1
(45) Date of Patent: Oct. 16, 2001

(54) MULTIBIT SIGMA-DELTA CONVERTERS EMPLOYING DYNAMIC ELEMENT MATCHING WITH REDUCED BASEBAND TONES

(75) Inventors: Kuan-Dar Chen; Tai-Haur Kuo, both of Tainan (TW)

(73) Assignees: Tai-Haur Kuo, Tainan; Taiwan Semiconductor Manufacturing Company; Silicon Integrated Systems Corp., both of Hsinchu, all of (TW)

( * ) Notice: Subject to any disclaimer, the term of this patent is extended or adjusted under 35 U.S.C. 154(b) by 0 days.

(21) Appl. No.: 09/186,316

(22) Filed: Nov. 4, 1998

(51) Int. Cl.[7] .............................. H03M 3/00; H03M 3/02; H03M 1/12
(52) U.S. Cl. .......................... 375/252; 341/143; 341/144
(58) Field of Search ...................................... 341/118, 142, 341/126, 155, 143, 144; 375/252, 254

(56) References Cited

U.S. PATENT DOCUMENTS

| | | | |
|---|---|---|---|
| 5,027,120 | * | 6/1991 | Thurston ............................... 341/143 |
| 5,221,926 | | 6/1993 | Jackson ................................. 341/118 |
| 5,928,313 | * | 11/1999 | Brooks et al. ........................ 341/143 |
| 6,081,216 | * | 1/2000 | May ..................................... 341/143 |
| 6,124,813 | * | 9/2000 | Robertson et al. ................... 341/143 |

OTHER PUBLICATIONS

Akira Yasuda et al., "A Third–Order Delta–Sigma Modulator Using Secon–Order Noise–Shaping Dynamic Element Matching", IEEE Journal of Solid–State Circuits, vol. 33, No. 12, pp. 1879–1886, Dec. 1998.*

I. Galton et al., "A Low–Complexity Dynamic Element Matching DAC for Direct Digital Systhesis", IEEE Transactions on Circuits and Systems—II: Analog and Digital Signal Processing, vol. 45, No. 1, pp. 13–27, Jan. 1998.*

Terri S. Fiez and Aria Eshraghi, "Delta–Sigma A/D Converter: The Next Generation", IEEE 1997, pp. 181–184.*

R.K. Henderson and O. J. A. P. Nys, "Dynamic Element Matching Techniques with Arbitrary Noise Shaping Function", IEEE 1996, pp. 293–296.*

* cited by examiner

Primary Examiner—Chi Pham
Assistant Examiner—Dung X. Nguyen
(74) Attorney, Agent, or Firm—Jackson Walker L.L.P.

(57) ABSTRACT

A method for reducing baseband tones and intermodulation distortions in a multibit sigma-delta converter employing dynamic element matching is disclosed. An N-level sigma-delta analog-to-digital converter includes an analog loop filter, an N-level quantizer, an element selection logic, an internal N-level digital-to-analog converter (DAC), and a decimation filter, where N is an integer greater than two. Adding k extra unit elements to the internal N-level DAC, which totally comprises (N−1+k) unit elements, can shift the sigma-delta modulator tones and intermodulation distortions outside the baseband with no change to the quantization levels of the internal N-level DAC, where k is a positive integer. A cyclical selection of (N−1+k) unit elements in the internal N-level DAC is in accordance with an element selection logic which receives an output of the N-level quantizer and produces a set of control signals for the element selection of the internal N-level DAC. The present invention can also be applied to a multibit sigma-delta digital-to-analog converter.

6 Claims, 14 Drawing Sheets

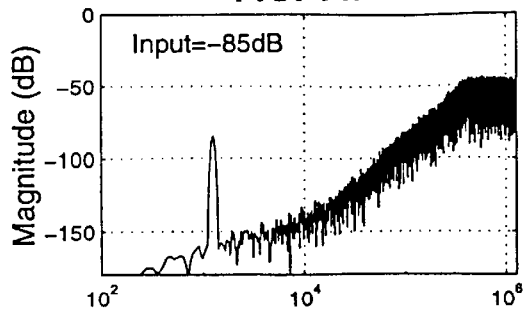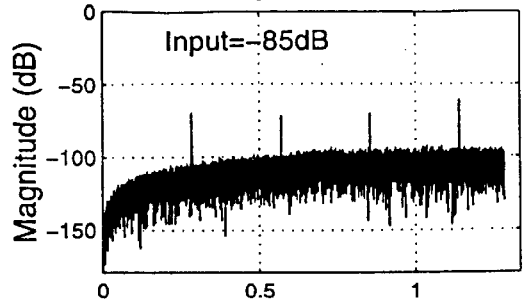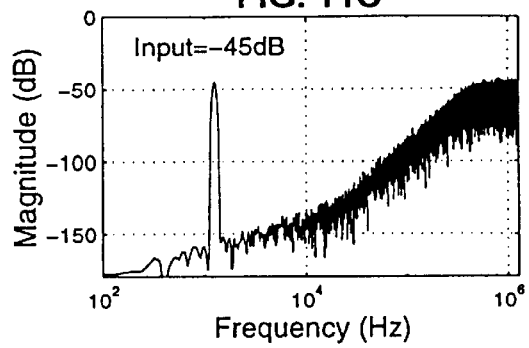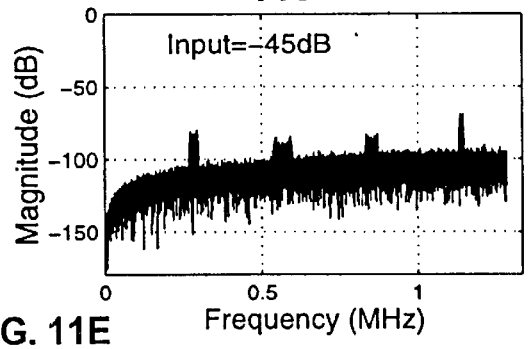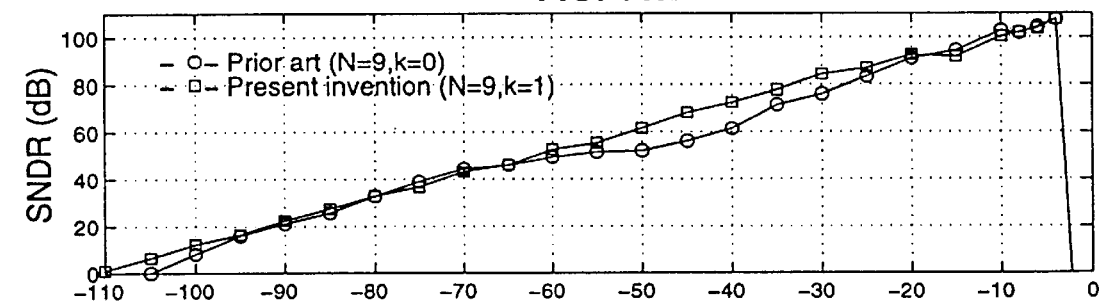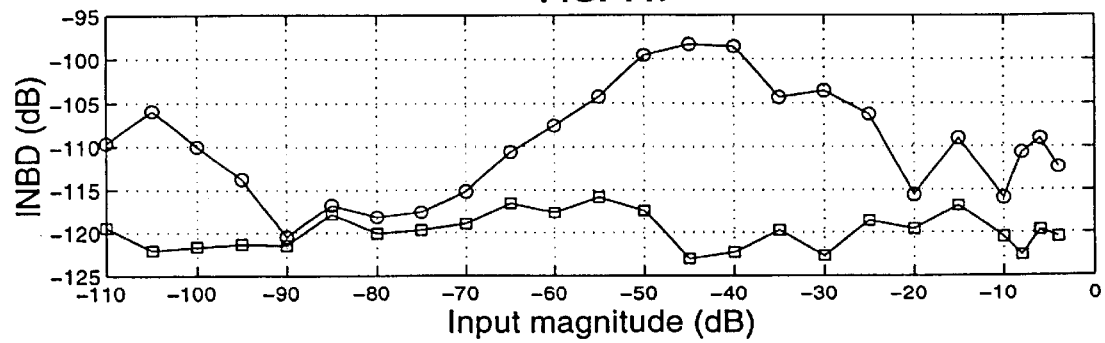

MULTIBIT SIGMA-DELTA CONVERTERS EMPLOYING DYNAMIC ELEMENT MATCHING WITH REDUCED BASEBAND TONES

FIELD OF THE INVENTION

The present invention relates in general to oversampling converters, and more particularly to multibit sigma-delta converters with dynamic element matching.

BACKGROUND OF THE INVENTION

Sigma-delta modulation has recently been a popular technique for obtaining high resolution data conversion. In such technique, high resolution results from oversampling, noise-shaping as well as noise filtering. Such technique has been successfully applied to DC measurement, voice band, audio processing, ISDN and communication system, etc. For detail discussion of sigma-delta modulation techniques, relevant to the principles and terminology that follows in the context, please refer to a selected reprint volume entitled "Overampling delta-sigma data converters", edited by J. C. Candy and G. C. Temes, IEEE Press, 1992.

One-bit sigma-delta modulators have achieved popularity for use in integrated circuit data converters due to the fact they employ a 1-bit internal DAC that dose not require precision component matching. However, the resolution that a 1-bit sigma-delta modulator can achieve at a given oversampling ratio is limited. Although the achievable resolution dose improve with increasing loop filter order, these improvements diminish rapidly due to instability. In addition, because of the substantial out-of-band quantization noise power in sigma-delta modulators, the design of analog output filters for oversampled digital-to-analog (D/A) converters can be quite difficult. One solution to the above problems is to use multibit quantization in the sigma-delta converters.

The primary advantage of sigma-delta modulators employing multibit quantization is that the quantization noise power can be reduced typically by 6 dB per additional bit. Therefore, we can increase the converter resolution without increasing the oversampling ratio. An additional benefit of multibit quantization is that it enhances the modulator stability. However, the internal multibit feedback digital-to-analog converter (DAC) of the multibit sigma-delta converter must have the same stringent linearity as the overall converter. This is because any internal DAC output conversion errors directly appear in the sigma-delta converter output, and moreover they can not be shaped by the modulator's loop filter.

The internal multibit DACs are commonly implemented with a plurality of unit components, such as capacitors, resistors, or current switches. For example, an internal multibit DAC can utilize a capacitor array wherein a digital input code is encoded into a set of control signals to select charging capacitors. The total stored charge is redistributed to provide an analog output voltage in response to the digital input code. Conventionally, to implement an N-level capacitive internal DAC requires (N–1) capacitors, where N is an integer greater than two. Component variations make the internal DAC transfer curve nonlinear. The linearity error manifests itself in the frequency domain in the form of distortion components at harmonic frequencies of the signal frequency.

To solve the nonlinearity problem in an internal DAC having a plurality of components, the prior art approach of digital self-calibration technique has been used to correct the internal DAC nonlinearity, as described in M. Sarhang-Nejad and G. C. Temes, "A high resolution multibit sigma-delta ADC with digital correction and relaxed amplifier requirements," IEEE Journal of Solid-State Circuits, pp. 648–990 (June, 1993). The technique typically require additional calibration circuits and increase circuit area and complexity.

Another known internal DAC nonlinearity correction approaches in oversampling converters are utilizing dynamic element matching techniques. The randomization of component switching breaks the nonlinearity error from noticeable discrete-frequency distortions in the baseband into random white noise which is spread over half of the sampling frequency, as described in R. Careley, "A noise-shaping coder topology for 15+bit converter," IEEE Journal of Solid-State Circuits, pp. 267–273 (April, 1989). In order to accomplish the random switching in an internal DAC having a plurality of components, such as a capacitor array, switching control signals are generated by a random number generator. Because only a pseudo-random number generator is physically possible implemented, not all of the nonlinearity error is converted from discrete-frequency distortions into random white noise.

A popular dynamic element matching technique called data weighted averaging (DWA) method can shape the distortions introduced by the non-ideal internal DAC to high frequencies where they can be removed by the following filtering, as described in R. T. Baird and T. S. Fiez, "Linearity enhancement of multibit sigma-delta A/D and D/A converters using data weighted averaging," IEEE Transactions on Circuits and Systems II, pp. 753–762 (December 1995). However, when the DWA method is applied to an internal multibit DAC of the multibit sigma-delta converter, substantial baseband tones and intermodulation distortions resulting from aliasing of the internal multibit DAC noise are found and they limit the performance of the overall sigma-delta converter. This problem plays a significant obstacle for utilizing the DWA method in a multibit sigma-delta converter. For tackling this problem, one can add dither in a multibit sigma-delta converter to break up and randomize the aliasing baseband tones, at cost of increasing baseband noise, reducing dynamic range, and possibly destabilizing the converter. Therefore, an efficient method for reducing baseband tones without adding dither in a multibit sigma-delta converter employing data weighted averaging method is necessary.

SUMMARY OF THE INVENTION

In this invention we disclose a method for reducing baseband tones and intermodulation distortions in a multibit sigma-delta analog-to-digital (A/D) and digital-to-analog (D/A) converter employing dynamic element matching, called data weighted averaging method, without adding dither. In accordance with the present invention, notable sigma-delta modulator (SDM) baseband tones can be shifted to high frequency bands and then they can be removed by following filtering.

An N-level sigma-delta analog-to-digital (A/D) converter comprises a sigma-delta modulator (SDM) having an analog loop filter, an N-level quantizer, an element selection logic, and an internal N-level digital-to-analog converter (DAC); and a decimation filter, where N is an integer greater than two. Conventionally, the internal N-level DAC has (N–1) unit elements with component mismatches which are cyclically selected to generate an analog signal in response to a digital input code from the N-level quantizer. Adding k extra unit elements to the internal N-level DAC, which totally comprises (N−1+k) unit elements, can shift the SDM tones outside the baseband, with no change to the quantization levels of the internal N-level DAC where k is a positive integer. The cyclical selection of (N−1+k) unit elements in the internal N-level DAC is in accordance with control signals generated by the element selection logic. The element selection logic receives an output of the N-level quantizer and produces a set of control signals for the element selection of the internal N-level DAC.

The present invention also can be applied to a multi-bit sigma-delta digital-to-analog (D/A) converter which comprises an interpolation filter, a digital sigma-delta modulator (SDM) with an m-bit output, an element selection logic, an internal m-bit DAC, and an analog post filter. Conventionally, the internal m-bit DAC has ($2^m$−1) unit elements with component mismatches which are cyclically selected to generate an analog signal in response to a digital input code from the digital SDM. Adding k extra unit elements to the internal m-bit DAC, which totally comprises ($2^m$−1+k) unit elements, can shift the SDM tones outside the baseband, with no change to the quantization levels of the internal m-bit DAC. The cyclical selection of ($2^m$−1+k) unit elements in the internal m-bit DAC is in accordance with control signals generated by the element selection logic. The element selection logic receives an output of the digital SDM and produces a set of control signals for the element selection of the internal m-bit DAC.

From the viewpoint of circuit implementation, preferably, k is one.

BRIEF DESCRIPTION OF THE DRAWINGS

For a more complete understanding of the present invention and its advantages, thereof, reference is now made to the following description taken in conjunction with the accompanying drawings in which:

FIG. 11 shows plots of (a) a 9-level SDM output spectrum and (b) an internal 9-level DAC noise spectrum with an input magnitude of −85 dB, (c) a SDM output spectrum and (d) an internal DAC noise spectrum with an input magnitude of −45 dB, and (e) SNDR and (f) INBD in accordance with the present invention where one extra unit element is added into the 9-level DAC(N=9, k=1), totally comprising 9 unit elements, and the input frequency is fs/2048.

DETAILED DESCRIPTION OF PREFERRED EMBODIMENTS OF THE INVENTION

Figure 1:
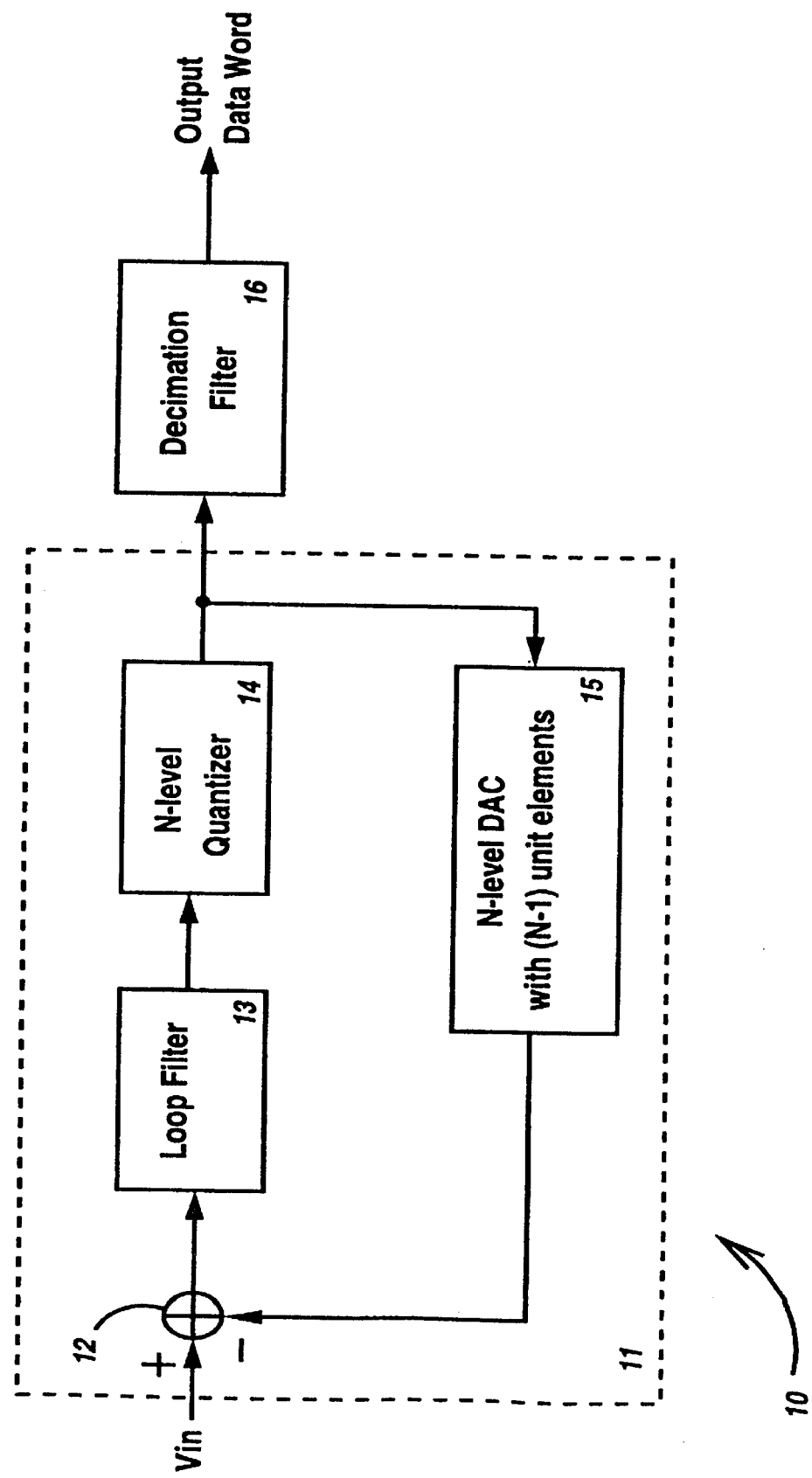
FIG. 1 illustrates a block diagram of a multi-bit (multi-level) sigma-delta analog-to-digital (A/D) converter known in the prior art.

The present invention discloses a sigma-delta modulator for use in an N-level sigma-delta analog-to-digital converter, N being an integer greater than two, which comprises:

a loop filter adapted to receive a summed signal of an analog input signal of said N-level sigma-delta analog-to-digital converter and an analog feedback signal in negative sense for generating a filter signal;

an N-level quantizer for quantizing said filter signal from said loop filter at frequency fs and providing a digital output code having a plurality of bits, wherein said digital output code is provided to a decimation filter from which an output word is provided as an output of said N-level sigma-delta analog-to-digital converter;

an element selection logic coupled to said N-level quantizer for generating a set of control signals, $S_0$, $S_1$, $S_2$, ..., $S_{(N−2+k)}$, in response to said digital output code from said N-level quantizer, wherein k is a positive integer;

an internal N-level digital-to-analog converter (DAC) coupled to said element selection logic containing (N−1+k) unit elements with component mismatches between said unit elements for providing said feedback signal to said loop filter in response to said digital output code from said N-level quantizer; wherein said element selection logic comprises
  a modulo-(N−1+k) adder having an input terminal for receiving said digital output code from said N-level quantizer and a second pointer (PTR2), and an output terminal for providing a first pointer (PTR1), wherein the first pointer (PTR1) is a sum (t) of said digital output code and PTR2, and is equal to a residual value of t dividing by (N−1+k) if t is greater than (N−2+k);
  an accumulator register coupled to said modulo-(N−1+k) adder having an input terminal for receiving said PTR1 and an output terminal for providing said PTR2, said accumulator register latching said PTR1 for a duration of one sampling period; and
  a control signal generator which receives said PTR1 and PTR2 and generates said set of (N−1+k) control signals, $S_0, S_1, S_2, \ldots, S_{(N-2+k)}$, wherein
    if (PTR1−1) modulo (N−1+k), r, is greater than PTR2, $S_{PTR2}, S_{(PTR2+1)}, \ldots, S_r$ are 1 and the others are 0,
    if (PTR1−1) modulo (N−1+k), r, is less than PTR2, $S_{PTR2}, S_{(PTR2+1)}, \ldots, S_{(N-2+k)}, S_0, S_1, \ldots, S_r$ are 1 and the others are 0, and
    if PTR1 is equal to PTR2, all the (N−1+k) control signals, $S_0, S_1, S_2, \ldots, S_{(N-2+k)}$ are 0; and
Said N-level digital-to-analog converter (DAC) further comprises a switch network for selectively connecting said (N−1+k) unit elements to a reference level or an analog ground terminal according to said set of (N−1+k) control signals, wherein an unit element is connected to said reference level when a corresponding control signal is 1, and to said analog ground terminal when said corresponding control signal is 0.

Preferably, said loop filter comprises cascaded analog integrator stages, wherein said cascaded analog integrator stages could be realized in either discrete-time or continuous-time circuits.

The present invention also discloses an m-bit sigma-delta digital-to-analog converter, m being an integer greater than two, which comprises:
  an interpolation filter having an input for receiving a digital word with a plurality of bits, sampled at a Nyquist-rate frequency, and an output for providing an interpolated digital word, sampled at a frequency which is higher than said Nyquist-rate frequency;
  a digital sigma-delta modulator containing a digital loop filter and an m-bit truncator, which receives said interpolated digital word from said interpolation filter and provides an m-bit truncated digital word, and wherein said digital loop filter receives a summed signal of said interpolated digital word and a truncated digital output in a negative feedback sense from said truncator and generates a pre-processed signal, and said truncator truncates said pre-processed signal to provide said m-bit truncated digital word;
  an element selection logic coupled to said digital sigma-delta modulator for generating a set of control signals, $S_0, S_1, S_2, \ldots, S_{(2^m-2+k)}$, in response to said truncated m-bit digital word from said digital sigma-delta modulator wherein k is a positive integer;
  an m-bit digital-to-analog converter (DAC) coupled to said element selection logic containing $(2^m-1+k)$ unit elements with component mismatches between said unit elements for providing an analog signal to a post analog filter in response to said m-bit truncated digital word from said digital sigma-delta modulator; wherein
said element selection logic comprises
  a modulo-$(2^m-1+k)$ adder having an input terminal for receiving said m-bit truncated digital word from said digital sigma-delta modulator and a second pointer (PTR2), and an output terminal for providing a first pointer (PTR1), wherein the first pointer (PTR1) is a sum (t) of said m-bit truncated digital word and PTR2, and is equal to a residual value of t divided by $(2^m-1+k)$ if t is greater than $(2^m-2+k)$;
  an accumulator register coupled to said modulo-$(2^m-1+k)$ adder having an input terminal for receiving said PTR1 and an output terminal for providing said PTR2, said accumulator register latching said PTR1 for a duration of one sampling period; and
  a control signal generator which receives said PTR1 and PTR2 and generates said set of $(2^m-1+k)$ control signals, $S_0, S_1, S_2, \ldots, S_{(2_{m-2+k})}$, wherein
    if (PTR1−1) modulo $(2^m-1+k)$, r, is greater than PTR2, $S_{PTR2}, S_{(PTR2+1)}, \ldots, S_r$ are 1 and the others are 0,
    if (PTR1−1) modulo $(2^m-1+k)$, r, is less than PTR2, $S_{PTR2}, S_{(PTR2+1)}, \ldots, S_{(2_{m-2+k})}, S_0, S_1, \ldots, S_r$ are 1 and the others are 0, and
    if PTR1 is equal to PTR2, all the (N−1+k) control signals, $S_0, S_1, S_2, \ldots, S_{(2_{m-2+k})}$ are 0; and
  said m-bit digital-to-analog converter (DAC) further comprises a switch network for selectively connecting said $(2^m-1+k)$ unit elements to a reference level or an analog ground terminal according to said set of $(2^m-1+k)$ control signals, wherein an unit element is connected to said reference level when a corresponding control signal is 1, and to said analog ground terminal when said corresponding control signal is 0.

FIG. 1 illustrates a block diagram of an N-level sigma-delta analog-to-digital (A/D) converter 10 known in the prior art where N is an integer greater than two. The A/D converter 10 comprises generally a sigma-delta modulator 11 and a decimation filter 16. The sigma-delta modulator 11 includes a summing device 12, a loop filter 13, an N-level quantizer 14, and an internal N-level digital-to-analog converter (DAC) 15. The summing device 12 receives an analog input signal labeled "Vin" and subtracts an analog feedback signal received from the internal N-level DAC 15 therefrom. The output of summing device 12 is coupled to the loop filter 13. The loop filter 13 includes cascaded analog integrator stages and provides an analog output to the N-level quantizer 14. The N-level quantizer 14 is an (N−1) threshold quantizer, which quantizes the analog output of the loop filter 13 at fs frequency, and provides a $[\log_2(N-1)]+1$ bits digital output code to the N-level DAC 15 and the decimation filter 16, where [x] means the greatest integer less than or equal to −x. The digital output code of the N-level quantizer 14 is from code 0 to code (N−1). The N-level DAC 15 has (N−1) unit elements with component mismatches and provides the analog feedback signal in response to the digitized output signal of the N-level quantizer 14. Decimation filter 15 provides an "Output Data Word" in response to the digital output code of the N-level quantizer 14 at the Nyquist rate.

The primary advantage of sigma-delta modulators employing multibit quantization is that the quantization noise power can be reduced typically by 6 dB per additional bit. However, the internal multibit feedback digital-to-analog converter (DAC) of the multibit sigma-delta converter must have the same stringent linearity as the overall converter. To solve the nonlinearity problem in the internal multibit DAC having a plurality of components, A popular dynamic element matching technique called data weighted averaging (DWA) method known in the prior art can shape the distortions introduced by the internal non-ideal DAC to high frequencies. However, when the DWA method is applied to the internal multibit DAC of the multibit sigma-delta converter, notable baseband tones and intermodulation distortions are found in the modulator output and they limit the performance of the overall sigma-delta converter.

Figure 2:
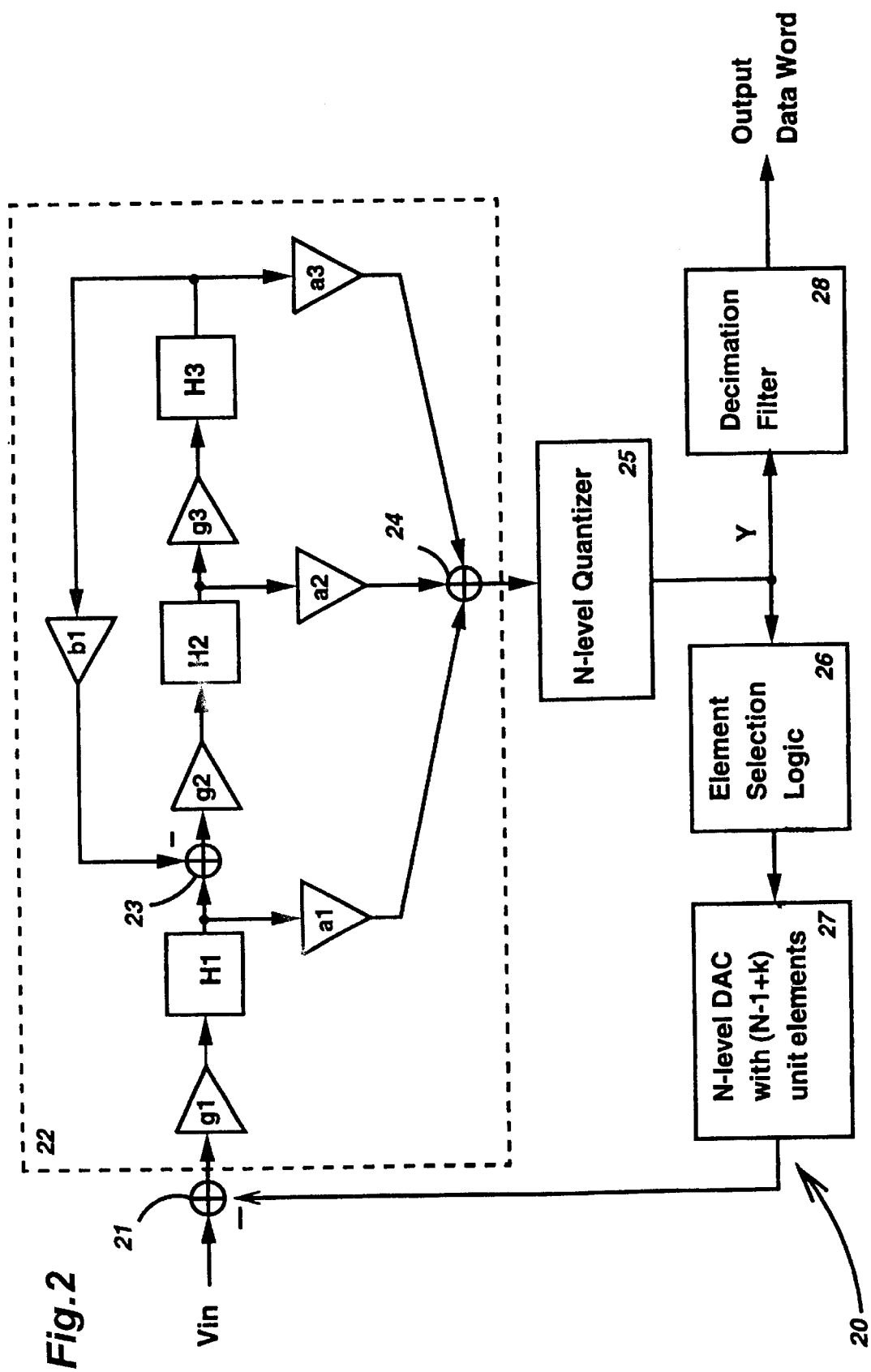
FIG. 2 illustrates a block diagram of a multi-level sigma-delta analog-to-digital (A/D) converter in accordance with the present invention.

FIG. 2 shows a preferred embodiment of our invention for reducing sigma-delta modulator baseband tones and illustrates a block diagram of a third-order N-level sigma-delta A/D converter 20 where N is an integer greater than two. The sigma-delta A/D converter 20 comprises generally a summing device 21, a loop filter 22, an N-level quantizer 25, an element selection logic 26, an internal N-level DAC 27, and a decimation filter 28. The summing device 21 receives an analog input signal labeled "Vin" and subtracts an analog feedback signal received from the N-level DAC 27. The output of summing device 21 is coupled to the loop filter 22. The analog output of the loop filter 22 is coupled to the N-level quantizer 25. N-level quantizer 25 is an (N−1) threshold quantizer, which quantizes the analog output of the loop filter 22 at fs frequency, and provides a $[\log_2(N-1)]+1$ bits digital output code Y to the element selection logic 26 and the decimation filter 28, where [x] means the greatest integer less than or equal to x. The digital output code of the N-level quantizer 25, Y, is from code 0 to code (N−1). Adding k extra unit elements to the N-level DAC 27 will not change the DAC quantization levels. The internal N-level DAC 27 totally has (N−1+k) unit elements with component mismatches and provide the analog feedback signal in response to the digital output code Y of the N-level quantizer 25, where k is a positive integer. It has to be noted that k extra unit elements are added into the internal N-level DAC 27 to reduce baseband tones of a multibit sigma-delta converter employing the DWA method. The decimation filter 28 provides an "Output Data Word" in response to the digital output code of the N-level quantizer 25 at the Nyquist rate. The loop filter 22 includes three cascaded analog integrator stages H1, H2, and H3 which form a feedforward configuration. The output of the summing device 21 is scaled by g1 and then is applied to an input terminal of the first integrator stage H1 which produce an output to a summing device 23 and to a summing device 24 after it is scaled by a1. The summing device 23 receives the output of the first integrator stage H1 and subtracts a feedback signal received from the output of the third integrator stage H3, scaled by b1. The output of summing device 23 is scaled by g2 and then is applied to an input terminal of the second integrator stage H2 which produces an output, scaled by g3, to an input terminal of the third integrator stage H3 and, scaled by a2, to the summing device 24. The output of the third integrator stage H3 is scaled by a 3 and then is applied to the summing device 24 from which the analog output of the loop filter 22 is generated by summation.

Figure 3:
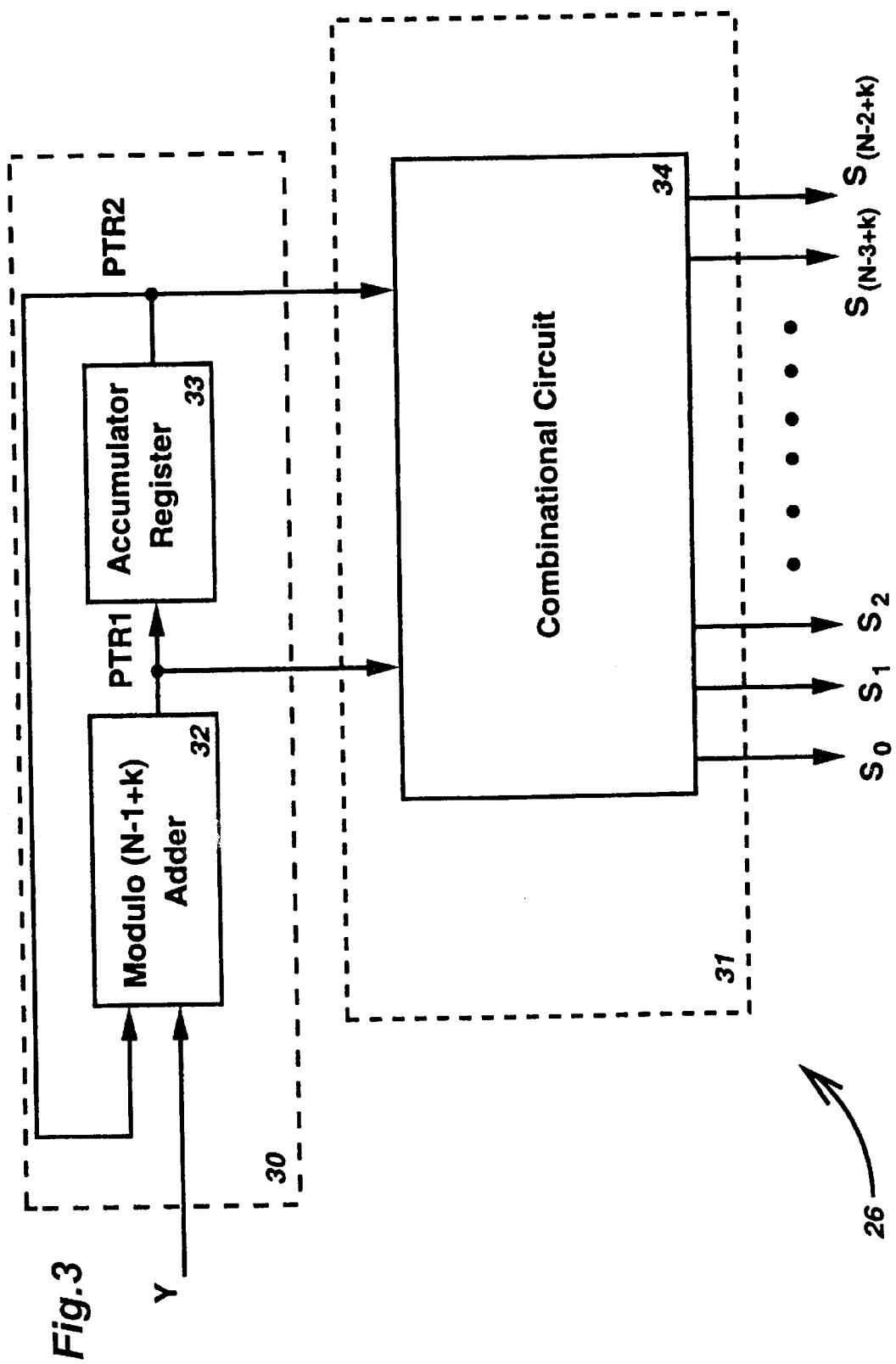
FIG. 3 illustrates a block diagram of a more detail function block of the element selection logic of FIG. 2 in accordance with the present invention.

FIG. 3 illustrates a detail block diagram of the element selection logic 26 in accordance with the present invention. The element selection logic 26 includes a pointer generator 30 and a control signal generator 31. The pointer generator 30 includes a modulo-(N−1+k) adder 32 and an accumulator register 33 where N and k are defined as above. The control signal generator 31 includes a combinational circuit 34. In the pointer generator 30, the modulo-(N−1+k) adder 32 receives the digital output code of the N-level quantizer 25 labeled "Y" and an output of accumulator register 33 labeled "PTR2", and provide a summation output as an output. The output of the modulo-(N−1+k) adder 32 labeled "PTR1" is applied to the accumulator register 33 and the control signal generator 31. The accumulator register 33 latches the output of the modulo-(N−1+k) adder 32 for a duration of one sampling clock which is equal to 1/fs. The output of the accumulator register 33 is applied to the modulo-(N−1+k) adder 32 and the control signal generator 31. In the control signal generator 31, the combinational circuit 34 receives PTR1 and PTR2 and produces a set of (N−1+k) control signal outputs labeled "$S_0$, $S_1$, $S_2$, . . . , $S_{(N-3+k)}$, and $S_{(N-2+k)}$". The function of the combinational circuit 33 is described as follows. If (PTR1−1) modulo (N−1+k), r, is greater than PTR2, $S_{PTR2}$, $S_{(PTR2+1)}$, . . . , and $S_r$ are 1 and the others are 0. If (PTR1−1) modulo (N−1+k), r, is less than PTR2, $S_{PTR2}$, S(PTR2+1), . . . , $S_{(N-2+k)}$, $S_0$, $S_1$, $S_2$, . . . , and $S_r$ are 1 and the others are 0. If PTR1 is equal to PTR2, all control signals are 0. The residual, r, of the modulo operation is equal to a residual value of the (PTR1−1) divided by (N−1+k) when (PTR1−1) is equal to or greater than zero. Or the residual, r, of the modulo operation is equal to a residual value of the (PTR1−1+N−1+k) divided by (N−1+k) when (PTR1−1) is less than zero. The control signals are used to control switching of (N−1+k) unit elements in the N-level DAC 27.

Figure 4:
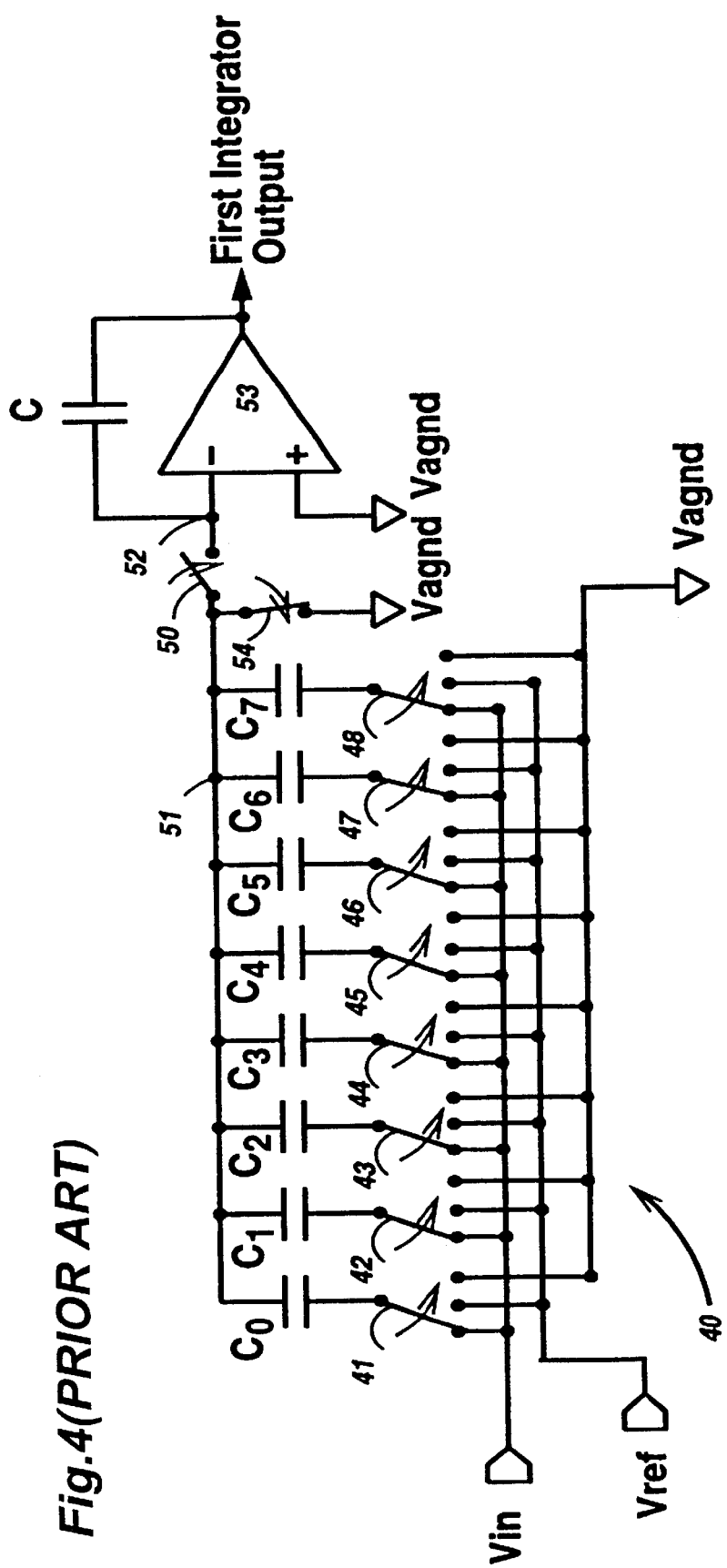
FIG. 4 illustrates a schematic diagram of an internal 9-level feedback switched-capacitor DAC with 8 unit capacitors incorporating a first stage integrator of the sigma-delta A/D converter known in the prior art.
Figure 5:
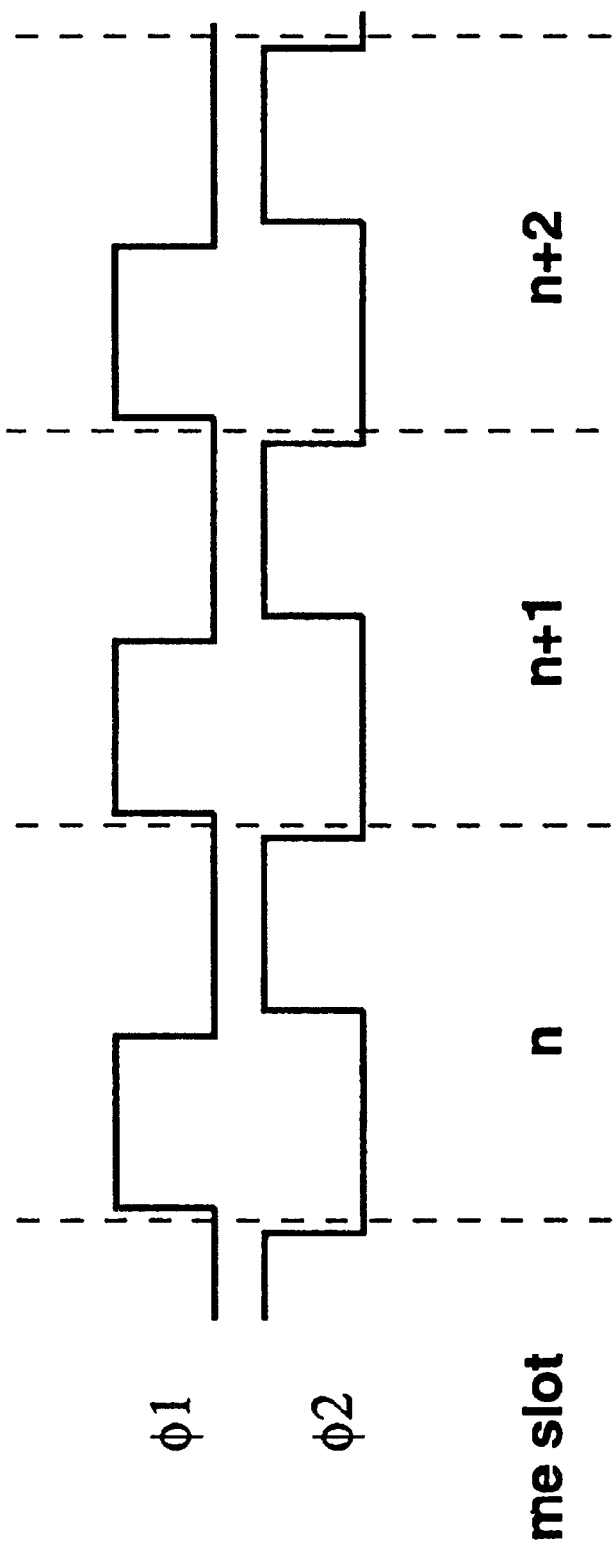
FIG. 5 illustrates a timing diagram for the internal 9-level feedback switched-capacitor DAC incorporating the first stage integrator of the sigma-delta A/D converter.

The internal N-level DAC are commonly implemented with a plurality of unit elements, such as capacitors, resistors, or current switches. For example, FIG. 4 illustrates a 9-level internal feedback DAC 40 combining the first integrator stage H1 in a 9-level sigma-delta A/D converter implemented by switched-capacitor circuits known in the prior art. Generally, the 9-level internal feedback DAC 40 has 8 unit capacitors $C_0$, $C_1$, . . . , and $C_7$. Because the capacitors $C_0$, $C_1$, . . . , and $C_7$ must be with component mismatches, the resulting effect is nonlinearity error in the output of the 9-level internal feedback DAC 40. The difference between the internal DAC output with component mismatches and the ideal DAC output is defined as DAC noise. Before describing the operation of the 9-level internal feedback DAC 40, the timing diagram for the operation of the clock signals φ1 and φ2 is shown in FIG. 5 where a time slot period is equal to 1/fs. In FIG. 4, each of the capacitors $C_0$, $C_1$, . . . , and $C_7$ has a top plate connected together at a node 15. Each of the capacitors $C_0$, $C_1$, . . . , and $C_7$ has a bottom plate which is respectively connected to switches 41–48. Each of the switches 41–48 connects the bottom plate of a predetermined capacitor to an analog input signal labeled "Vin" in the φ1 phase as shown in FIG. 5, and either to an analog ground terminal labeled "Vagnd" or to a reference voltage labeled "Vref" in response to control signals provided by the N-level quantizer 14 in FIG. 1, in the φ2 phase. Switch 54 connects the node 51 to the analog ground terminal Vagnd in the φ1 phase. Switch 50 connects the node 51 to a negative input terminal of an operational amplifier 53 in the φ2 phase. A positive input terminal of the operational amplifier 53 is also connected to the analog ground terminal Vagnd. A feedback capacitor C has a top plate connected to a node 52 and a bottom plate connected to an output of the operational amplifier 53 for providing an analog output signal labeled "First Integrator Output".

Figure 6:
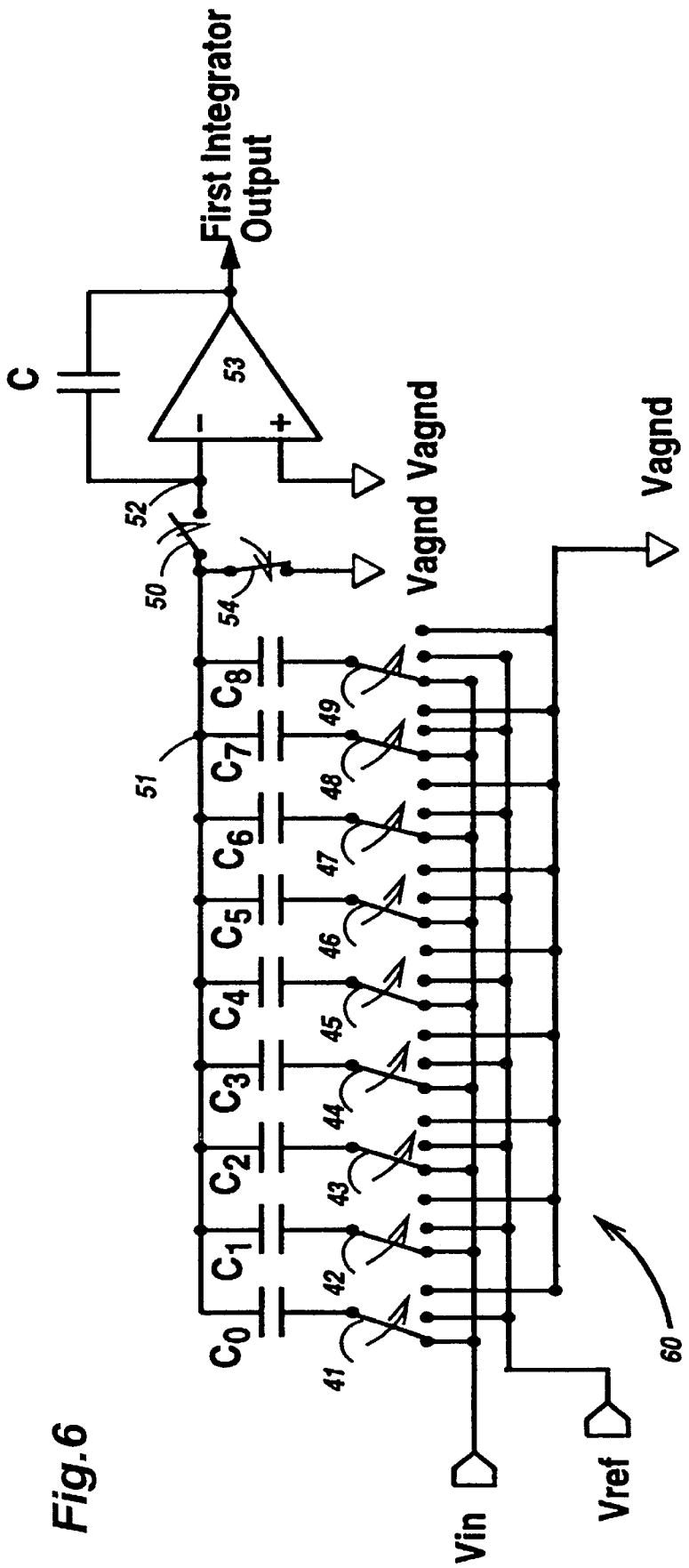
FIG. 6 illustrates a schematic diagram of an internal 9-level feedback switched-capacitor DAC with 9 unit capacitors incorporating a first stage integrator of the sigma-delta A/D converter in accordance with the present invention.

FIG. 6 illustrates a 9-level internal feedback DAC 60 combining the first integrator stage H1 in a 9-level sigma-delta A/D converter in accordance with the present invention. In this example, an extra unit capacitor $C_8$ is added into the 9-level internal feedback DAC 60, i.e. N=9, and k=1 for the internal N-level DAC 27 shown in FIG. 2. Therefore, the 9-level internal feedback DAC 60 totally has 9 unit capacitors $C_0$, $C_1$, . . . , and $C_8$ and corresponding switches 41–49. Because the capacitors $C_0$, $C_1$, . . . , and $C_8$ must be with component mismatches, the resulting effect is nonlinearity error in the output of the 9-level internal feedback DAC 60. The difference between the internal DAC output with component mismatches and the ideal DAC output is defined as DAC noise. In FIG. 6, each of the capacitors $C_0, C_1, \ldots,$ and $C_8$ has a top plate connected together at a node 51. Each of the capacitors $C_0, C_1, \ldots,$ and $C_8$ has a bottom plate which is respectively connected to the switches 41–49. Each of the switches 41–49 connects the bottom plate of a predetermined capacitor to an analog input signal labeled "Vin" in the φ1 phase as shown in FIG. 5, and either to an analog ground terminal labeled "Vagnd" or to a reference voltage labeled "Vref" in accordance with the control signals provided by the element selection logic 26, $S_0, S_1, S_2, \ldots,$ $S(N-3+k)$, and $S_{(N-2+k)}$, respectively, in the φ2 phase. Switch 54 connects the node 51 to the analog ground terminal Vagnd in the φ1 phase. Switch 50 connects the node 51 to a negative input terminal of an operational amplifier 53 in the φ2 phase. A positive input terminal of the operational amplifier 53 is also connected to the analog ground terminal Vagnd. A feedback capacitor C has a top plate connected to a node 52 and a bottom plate connected to an output of operational amplifier 53 for providing an analog output signal labeled "First Integrator Output".

Each of the switches 41–49 in FIG. 6 connects either to the reference voltage Vref or to the analog ground terminal Vagnd in the φ2 phase for generating an analog output with inverse polarity of the internal feedback DAC 60. Switching of the switches 41–49 is controlled by the control signals, $S_0, S_1, S_2, \ldots, S_{(N-3+k)},$ and $S_{(N-2+k)}$, where N=9 and k=1. If Si is 1, Ci is connected to Vref where $0 \leq \leq (N-2+k)$. If Si is 0, Ci is connected to Vagnd.

Figure 7:
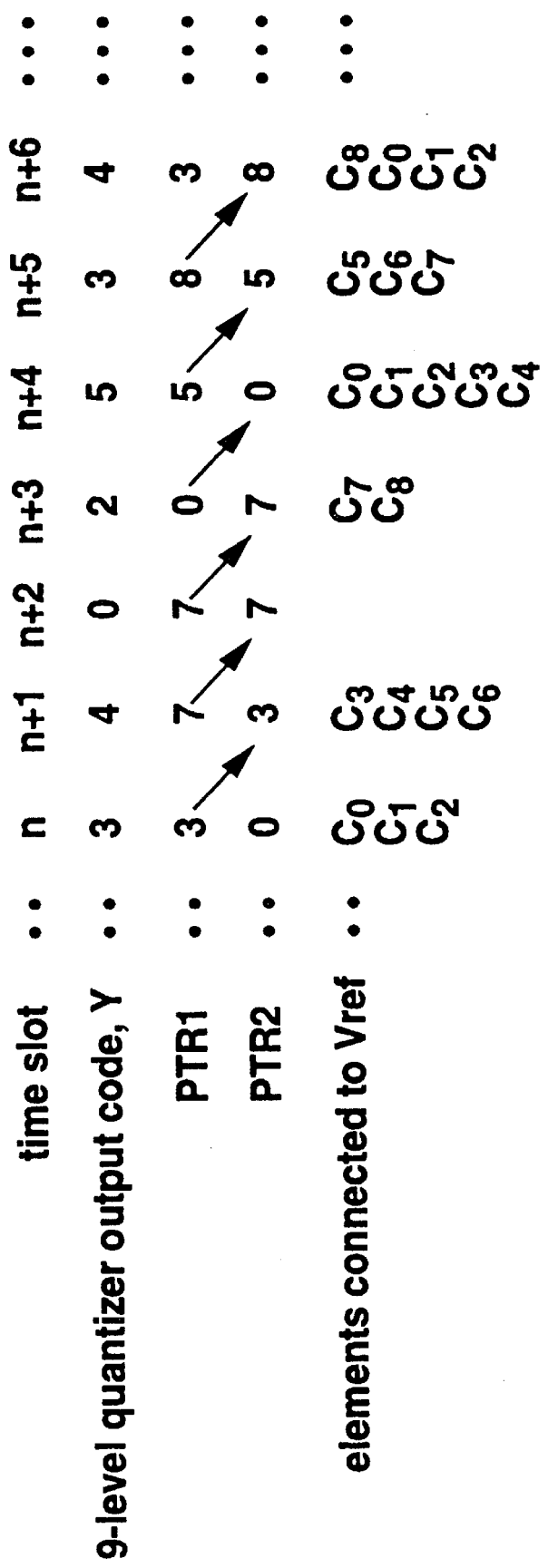
FIG. 7 illustrates a table form which shows the operation of the element selection logic and the selection of the 9 capacitors in FIG. 6 incorporating the present invention.

FIG. 7 shows how the switching of the switches 41–49 in FIG. 6 by way of illustration only. The number of the switches 41–49 which is required to be connected to the reference voltage Vref will vary with the digital output code of the N level quantizer, Y. Particularly, in FIG. 7, the capacitors connected to the reference voltage Vref are indicated in a column. The other capacitors are connected to the analog ground voltage Vagnd. It should be noted that the total number of capacitors to be connected to the reference voltage is equal to the digital output code Y of the N-level quantizer. It should be well understood that although the 9-level internal feedback DAC 60 in FIG. 6 added one extra unit capacitor and having totally 9 capacitors is illustrated, the present invention may be used with an internal N-level DAC in which k extra unit capacitors are added where N is an integer greater than two and k is a positive integer.

In FIG. 7, assume that at time slot n the digital output code Y of the 9-level quantizer is code 3, PTR1 and PTR2 in the element section logic 26 are 3 and 0, respectively, the control signal outputs of the element section logic 26, $S_0, S_1, S_2, \ldots, S_{(N-3+k)},$ and $S_{(N-2+k)}$, are 1, 1, 1, 0, 0, 0, 0, 0, and 0, respectively, where N=9 and k=1. Therefore, $C_0, C_1,$ and $C_2$ are connected to Vref and the others are connected to Vagnd. At time slot (n+1) assume that the digital output code Y of the 9-level quantizer is code 4, PTR1 is equal to the modulo summation of the quantizer output code at time slot (n+1) and PTR1 at time slot n. The modulo summation means that if the summation output, t, is greater than (N−2+k), the output value is equal to t modulo (N−1+k). PTR2 at time slot (n+1) is equal to PTR1 at time slot n. The control signal outputs of the element section logic 26, $S_0, S_1, S_2, \ldots, S_7,$ and $S_8$, are 0, 0, 0, 1, 1, 1, 1, 0, and 0, respectively, As a result, $C_4, C_5, C_6$ and $C_7$ are connected to Vref and the others are connected to Vagnd. At time slot (n+2) assume that the digital output code of the 9-level quantizer is code 0, PTR1 is equal to the modulo summation of the quantizer output code at time slot (n+2) and PTR1 at time slot (n+1). PTR2 at time slot (n+2) is equal to PTR1 at time slot (n+1). Therefore, PTR1 is equal to PTR2. All control signal outputs of the element section logic 26, $S_0, S_1, S_2, \ldots, S_7,$ and $S_8$, are 0. As a result, no capacitor is connected to Vref and all are connected to Vagnd. At time slot (n+3) assume that the digital output code of the 9-level quantizer is code 2, PTR1 is equal to the modulo summation of the quantizer output code at time slot (n+3) and PTR1 at time slot (n+2). PTR2 at time slot (n+3) is equal to PTR1 at time slot (n+2). The control signal outputs of the element section logic 26, $S_0, S_1, S_2, \ldots, S_7,$ and $S_8$, are 0, 0, 0, 0, 0, 0, 0, 1, and 1, respectively, As a result, $C_7$ and $C_8$ are connected to Vref and the others are connected to Vagnd. At time slot (n+4) assume that digital output code of the 9-level quantizer is 5, PTR1 is equal to the modulo summation of the quantizer output code at time slot (n+4) and PTR1 at time slot (n+3). The control signal outputs of the element section logic 26, $S_0, S_1, S_2, \ldots, S_7,$ and $S_8$, are 1, 1, 1, 1, 1, 0, 0, and 0, respectively, As a result, $C_0, C_1, C_2, C_3,$ and $C_4$ are connected to Vref and the others are connected to Vagnd. At time slot (n+5) assume that the digital output code of the 9-level quantizer is code 3, PTR1 is equal to the modulo summation of the quantizer output code at time slot (n+5) and PTR1 at time slot (n+4). The control signal outputs of the element section logic 26, $S_0, S_1, S_2, \ldots, S_7,$ and $S_8$, are 0, 0, 0, 0, 0, 1, 1, 1, and 0, respectively, As a result, $C_5, C_6,$ and $C_7$ are connected to $V^{ref}$ and the others are connected to Vagnd. At time slot (n+6) assume that the digital output code of the 9-level quantizer output is code 4, PTR1 is equal to the modulo summation of the quantizer output code at time slot (n+6) and PTR1 at time slot (n+5). Moreover, (PTR1-1) modulo 9, 2, is smaller than PTR2. The control signal outputs of the element section logic 26, $S_0, S_1, S_2, \ldots, S_7$, and $S_8$, are 1, 1, 1, 0, 0, 0, 0, 0, and 1, respectively, As a result, $C_8, C_0, C_1,$ and $C_2$ are connected to Vref and the others are connected to Vagnd.

Figure 8:
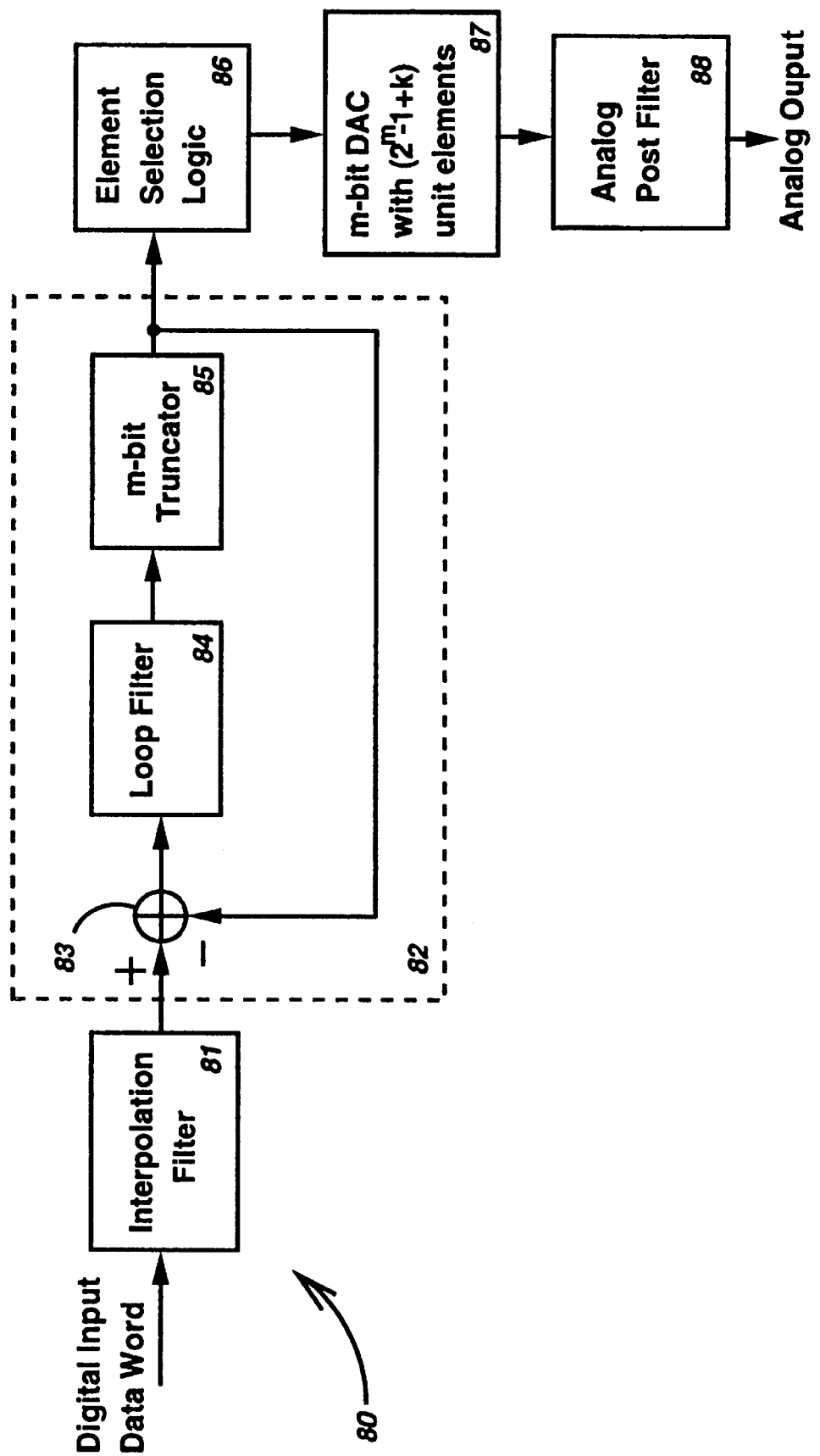
FIG. 8 illustrates a block diagram of a multi-bit sigma-delta digital-to-analog (D/A) converter in accordance with the present invention.

The present invention also can be applied to a multibit sigma-delta digital-to-analog (D/A) converter. FIG. 8 illustrates a block diagram of an m-bit sigma-delta digital-to-analog (D/A) converter 80 in accordance with the present invention where m is an integer greater than one. The sigma-delta D/A converter 80 comprises a digital interpolation filter 81, a digital sigma-delta modulator 82, an element selection logic 86, an internal m-bit DAC 87, and an analog post filter 88. The interpolation filter 81 receives a digital input signal labeled "Digital Input Data Word" with Nyquist rate sampling frequency, and provides a digital output for upsampling the digital input signal. The digital output of the interpolation filter 81 is applied to the digital sigma-delta modulator 82. The digital sigma-delta modulator 82 contains a digital loop filter 84 and an m-bit truncator 85 in a negative feedback configuration for shaping truncation noise generated by the m-bit truncator 85. The digital loop filter 84 receives a summed signal of the digital output of the interpolation filter 81 and a truncated digital output code in a negative sense from the m-bit truncator 85 for generating a pre-processed signal. The m-bit truncator 85 truncates the pre-processed signal to the m-bit truncated digital output code. The truncated digital output code of the digital sigma-delta modulator 82 is applied to the element selection logic 86. The output of the element selection logic 86 comprises $(2^m-1+k)$ control signal outputs, which are applied to the internal m-bit DAC 87, where k is a positive integer. Adding k extra unit elements to the internal m-bit DAC 87 will not change the DAC quantization levels. The internal m-bit DAC 87 totally has ($2^m-1+k$) unit elements with component mismatches and produces an analog voltage in response to the truncated digital output code of the digital sigma-delta modulator 82. The output of the internal m-bit DAC 87 is applied to the analog post filter 88. The analog post filter 88 removes out-of-band tones and quantization noise and produces an "Analog Output".

In the D/A converter 80 shown in FIG. 8, the element selection logic 86 and the internal multibit DAC 87 have the same configuration as the element selection logic 26 shown in FIG. 2 and 3 and the internal N-level DAC 27 illustrated in FIG. 6, respectively, and are operated in the same way.

Figure 9:
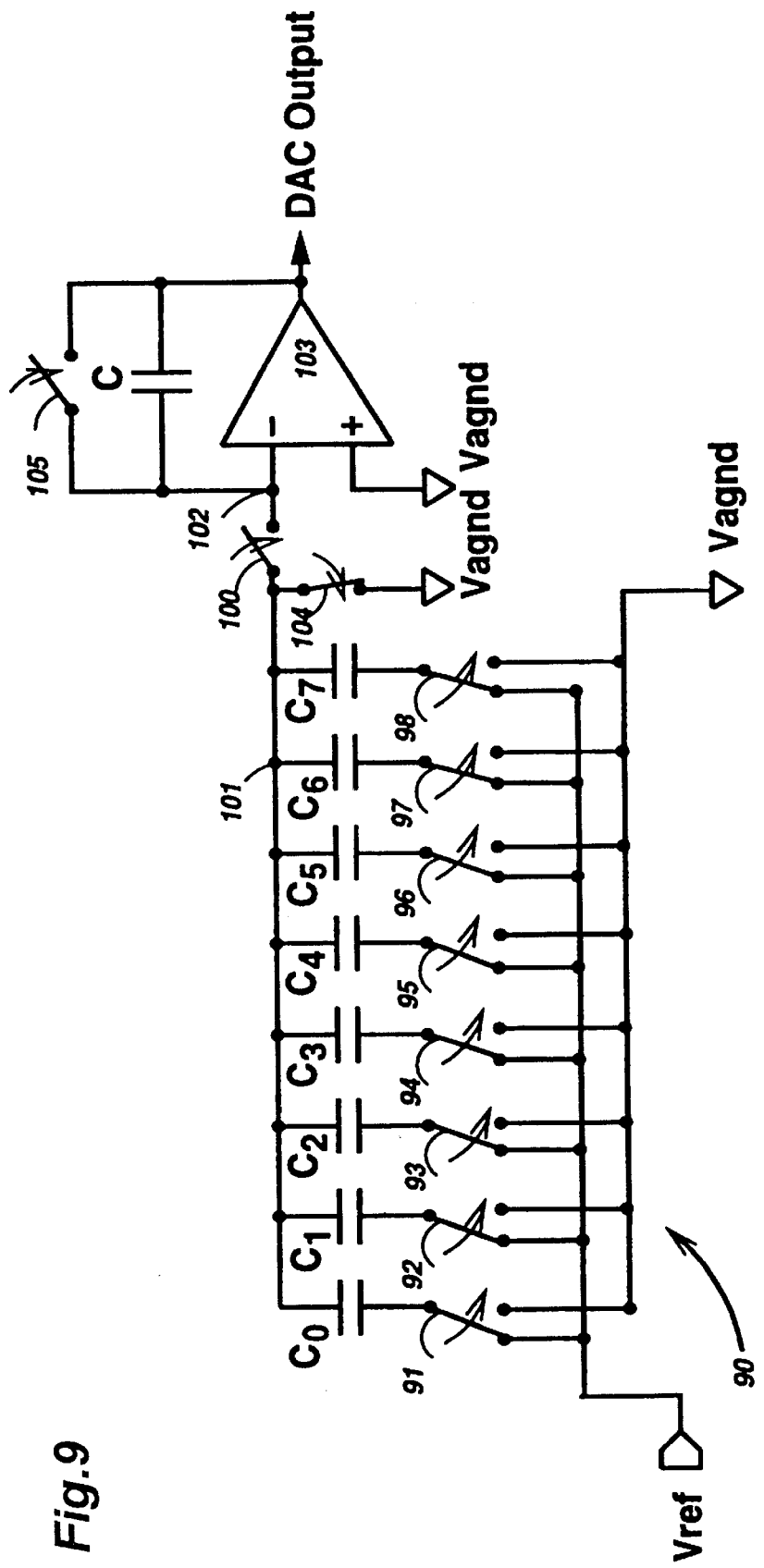
FIG. 9 illustrates a schematic diagram of an internal 3-bit (8-level) switched-capacitor DAC with 8 unit capacitors in the sigma-delta D/A converter in accordance with the present invention.

FIG. 9 illustrates an internal 3-bit DAC 90 in a 3-bit sigma-delta D/A converter in accordance with the present invention. In this example, an extra unit capacitor $C_7$ is added into the 3-bit DAC 90, i.e. m=3 and k=1, for the internal m-bit DAC 87 shown in FIG. 8. Therefore, the 3-bit DAC 90 totally has 8 unit capacitors $C_0$, $C_1$, ..., and $C_7$. Because the capacitors $C_0$, $C_1$, ..., and $C_7$ must be with component mismatches, the resulting effect is nonlinearity error in the output of the internal 3-bit DAC 90. The difference between the DAC output with component mismatches and the ideal DAC output is defined as DAC noise. In FIG. 9, each of the capacitors $C_0$, $C_1$, ..., and $C_7$ has a top plate connected together at a node 101. Each of the capacitors $C_0$, $C_1$, ..., and $C_7$ has a bottom plate which is respectively connected to switches 91–98. Each of the switches 91–98 connects the bottom plate of a predetermined capacitor either to an analog ground terminal labeled "Vagnd" or to a reference voltage labeled "Vref" in accordance with the control signals provided by the element selection logic 86 in FIG. 8 in the φ1 phase, and to the analog ground terminal in the φ2 phase. Switch 104 connects the node 101 to the analog ground terminal Vagnd in the φ1 phase. Switch 100 connects the node 101 to a negative input terminal of an operational amplifier 103 in the φ2 phase. A positive input terminal of the operational amplifier 103 is also connected to the analog ground terminal Vagnd. Switch 105 connects a node 102 and an output of operational amplifier 103 for resetting a feedback capacitor C charge. The feedback capacitor C has a top plate connected to a node 102 and a bottom plate connected to the output of the operational amplifier 103 for providing an analog output signal labeled "DAC Output".

Figure 10A:
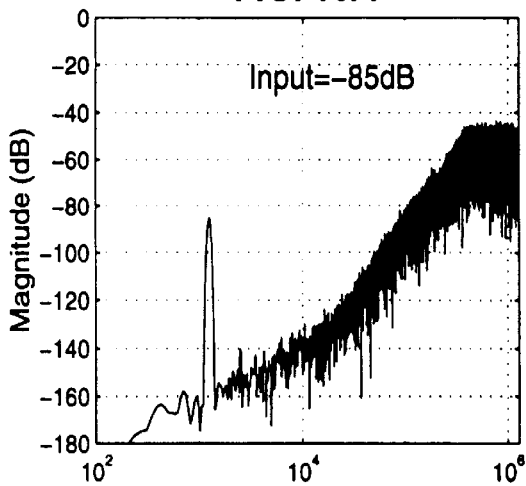
FIG. 10 shows output spectra of a 9-level sigma-delta modulator (SDM) which includes an internal 9-level DAC having 8 unit elements with 0.5% component mismatches employing a dynamic element matching technique called data weighted averaging method in the prior art, with the input magnitudes of (a) −85 dB, (c) −45 dB and (e) −4 dB. The corresponding DAC noise spectra are shown in (b), (d) and (f). In (a), (c) and (e), the unit of X-axis is Hz in log scale. In (b), (d) and (f), the unit of X-axis is MHz in linear scale.
Figure 10B:
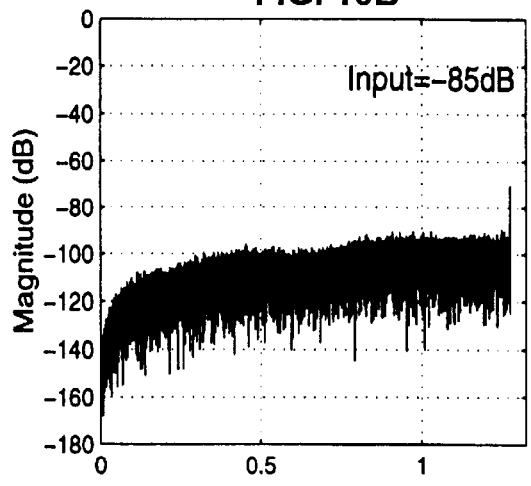
Figure 10C:
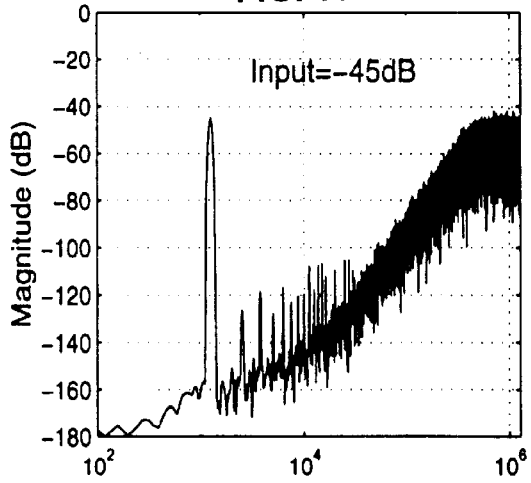
Figure 10D:
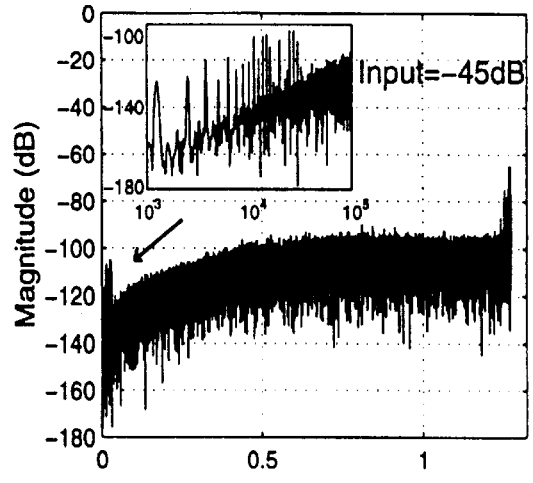
Figure 10E:
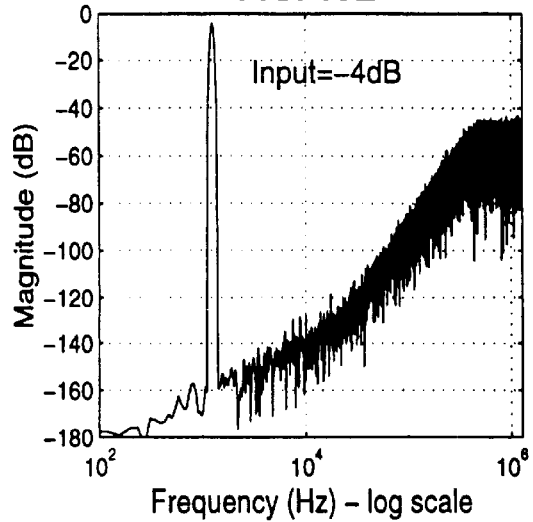
Figure 10F:
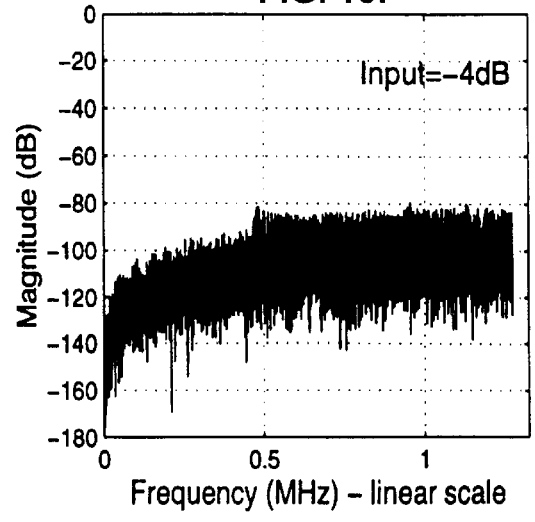

In the following, we show several simulation results of our invention. The third-order feedforward sigma-delta modulator shown in FIG. 2 is illustrated as a simulation example. The sigma-delta modulator with an OSR of 64, 20 kHz bandwidth, and 2.56 MHz sampling frequency includes three stages discrete-time integrators H1–H3, a 9-level quantizer, an element election logic, and a 9-level DAC. The modulator coefficients are: a1=0.64935, a2=0.41667, a3=0.62176, g1=2.93018, g2=1.19595, g3=0.19686, b1=0.00767. In the prior art, the 9-level DAC having 8 unit elements (N=8, k=0), whose component mismatches are e0=−0.501779%, e1=0.19979%, e2=−0.11094%, e3=0.43524%, e4=0.10560%, e5=−0.137916%, e6=−0.491779% and e7=0.50178%, is used for simulation. Element selection of the 9-level DAC depends on the output code of the quantizer and is controlled by the element selection logic. When the SDM input magnitude is very small, the largest portion of the DAC input codes, i.e. the SDM output codes, are almost exclusively concentrated at the middle of a full scale of the SDM's internal DAC. For example, with a −85 dB SDM input magnitude, codes 3, 4, and 5 occupy 21%, 58% and 21% of the DAC input codes, respectively. The distribution of DAC input codes is very non-uniform. Because the probability of code 4 is much larger than the others, the notable DAC tone frequency fs/2 will appear as shown in FIG. 10(b). Because the tone level is lower than the SDM quantization noise level, no obvious tones, aliased from the DAC tones, are observed in the SDM output spectrum of FIG. 10(a). When the SDM input magnitude is large, the input of the SDM's internal multi-level quantizer has a wider range of variations within the full scale. For an SDM input magnitude of −4 dB, the DAC input code probabilities, from code 1 to code 7, are 9.5%, 18.2%, 15.2%, 13.2%, 15.1%, 18.4% and 9.4%, respectively. No obvious tones are observed in the baseband, as shown in FIGS. 10(e) and 10(f). However, with medium SDM inputs ranging between −60 dB and −30 dB, notable DAC tones are observed in two bands, one centered at dc and the other centered at fs/2. As a result, many of the DAC tones are aliased to the SDM baseband. For example, at −45 dB SDM input, DAC input codes 3, 4 and 5 occupy 24%, 52% and 24% of the DAC input codes, respectively. Substantial tones in the baseband of the SDM output, shown in FIG. 10(c), are aliased from DAC tones, as shown in FIG. 10(d). These tones reach 25 dB above the noise floor in the baseband. Further, the aliased tones outside the modulator output baseband are not obvious since their levels are below the SDM quantization noise floor.

For an N-level SDM where N is an even number, having (N−1) unit elements for the DAC causes DAC notable tones near fs/2 because, at small SDM input amplitudes, DAC input codes mostly concentrate at code (N−1)/2. The present invention reduces SDM baseband tones by adding k extra unit elements to the selection elements of the SDM internal DAC, thereby moving notable tones out of the baseband, with no change to the quantization levels of the SDM's internal quantizer and DAC. Inputting dc codes to the DAC with k extra elements, DAC tones are shifted to $$f_{tone} = \frac{r}{N+k} \cdot f_s \cdot n \quad n = 1, 2, 3 \ldots \quad (1)$$

where r is the greatest common denominator (g.c.d.) value of the DAC input code and the total number of unit elements (N+k).

For example, one extra unit element (i.e. k=1) added to shift the tones is illustrated for present invention. Thus, for the 9-level DAC, the total unit elements becomes 9 (N=8, k=1). Since code 4 is the most probable DAC input at small SDM input magnitude, according to Eq. (1), therefore, notable DAC tones are shifted to frequencies near fs/9·n where n is a positive integer. No obvious DAC tones close to fs/2 and thus no obvious tones are aliased in the baseband. Simulation results confirm this analysis. SDM output spectra (N=9, k=1, DAC having 9 unit elements, and SDM input magnitude of −85 dB) is plotted in FIG. 11(a). The corresponding DAC noise spectra plotted in FIG. 11(b) shows that the notable DAC tones are moved to fs/9·n. In FIGS. 11(c) and 11(d), SDM output and DAC noise spectra, with an input magnitude of −45 dB, show no obvious baseband tones compared with FIGS. 10(c) and 10(d). The present invention significantly improves signal-to-(noise and distortion) ratio (SNDR) and in-band distortion (INBD), which is the total power of in-band tones above the noise level, as shown in FIGS. 11(e) and 11(f), respectively.

Figure 12A:
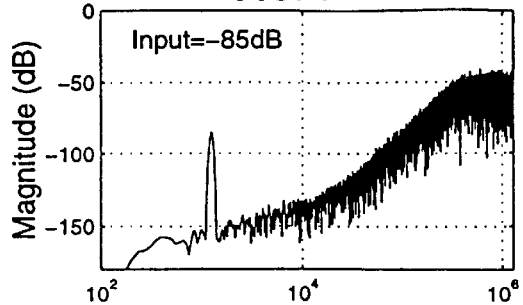
FIG. 12 shows plots of (a) a 8-level SDM output spectrum and (b) an internal 8-level DAC noise spectrum with an input magnitude of −85 dB, (c) a SDM output spectrum and (d) internal DAC noise spectrum with an input magnitude of −45 dB, and (e) SNDR and (f) INBD in accordance with the present invention where one extra unit element is added into the internal 8-level DAC(N=8, k=1), totally comprising 8 unit elements, and the input freuency is fs/2048.
Figure 12C:
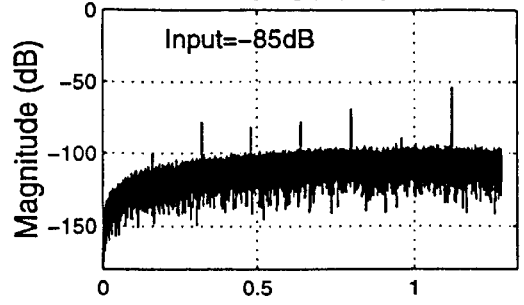
Figure 12B:
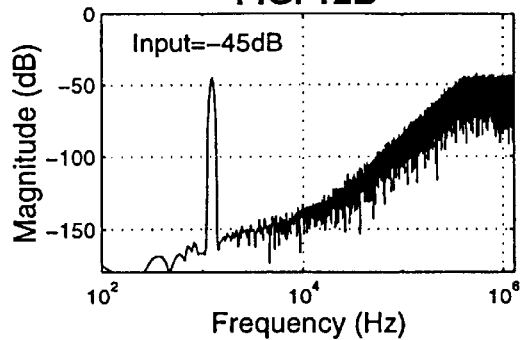
Figure 12D:
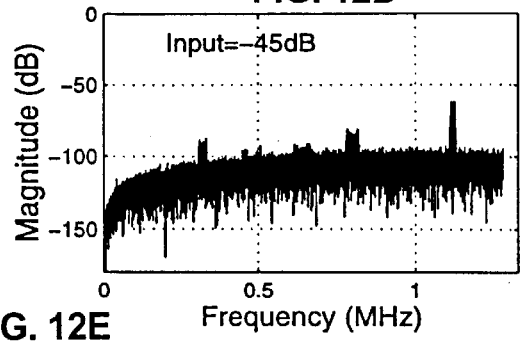
Figure 12E:
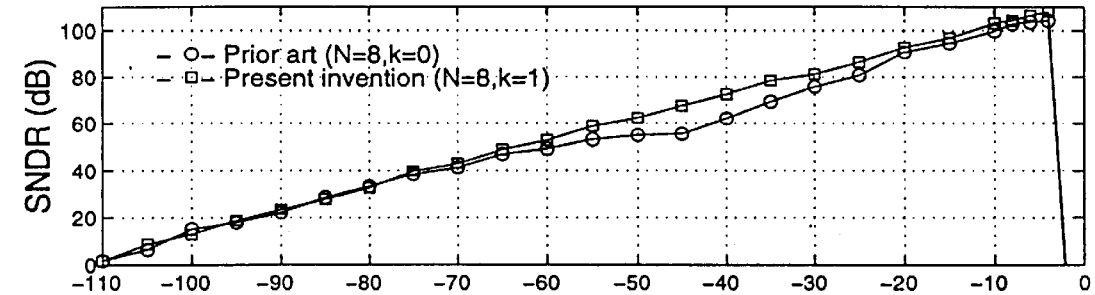
Figure 12F:
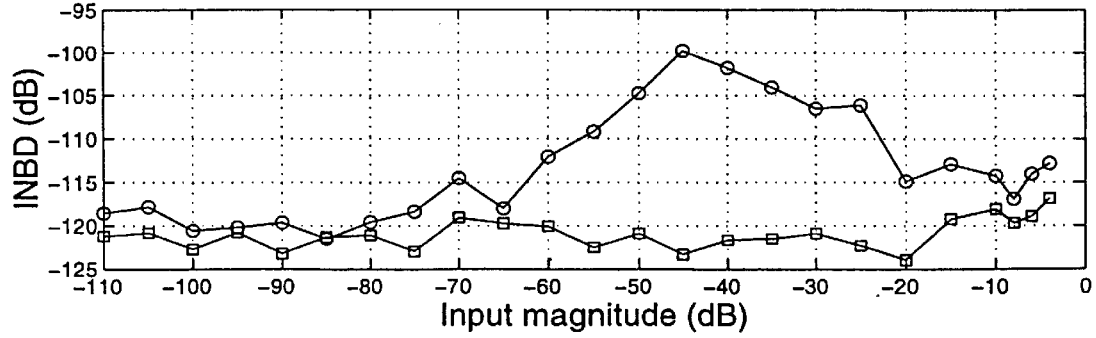

For an N-level SDM where N is an even number, having (N−1) unit elements for the DAC causes DAC notable tones near fs/2 because, at small SDM input amplitudes, DAC input codes mostly concentrate at codes (N−2)/2 and N/2, these codes having a high probability of being interleaved with each other. Adding k extra unit elements to the DAC can move the notable tones away from fs/2, resulting in reduced baseband aliasing tone power. k extra unit elements added to the SDM's internal DAC does not change the quantization levels. At small SDM input magnitudes, notable DAC tones are shifted to $$f_{tone} = \frac{r}{2(N+k)} \cdot f_s \cdot n \quad n = 1, 2, 3 \ldots \quad (2)$$

where r is the g.c.d. value of the number of N and the number of total unit elements (N+k). Only one extra unit element added is illustrated as examples. For the 8-level DAC (N=8, k=1), the number of unit elements becomes 8. Tone power originally concentrated at fs/2 is broken and distributed near fs/16·n. FIGS. 12(a)–12(d) show the SDM output and DAC noise spectra incorporating the present invention, with no notable tones aliased to the baseband. SNDR and INBD are significantly improved as shown in FIGS. 12(e) and 12(f), respectively.

Figure 13A:
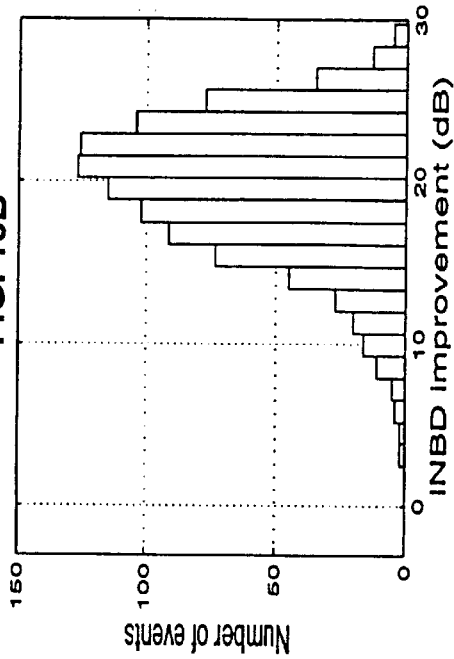
FIG. 13 shows histograms of (a) SNDR and (b) INBD improvements for the internal 9-level DAC (N=9, k=1), and (c) SNDR and (d) INBD improvements for the internal 8-level DAC (N=8, k=1) in accordance with the present invention where the input magnitude is −45 dB and maximum component mismatch is 0.5%.
Figure 13B:
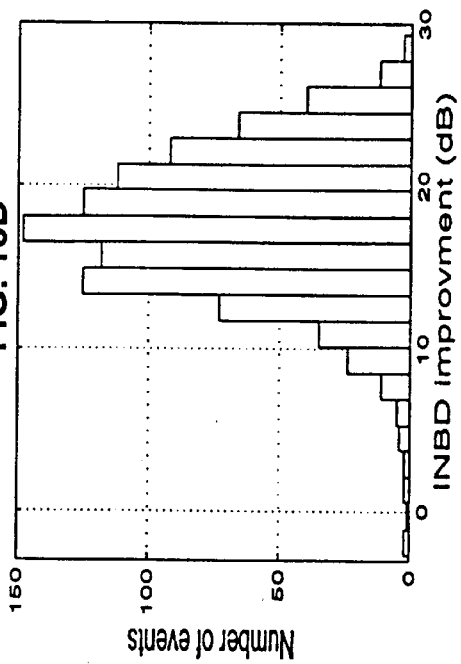
Figure 14A:
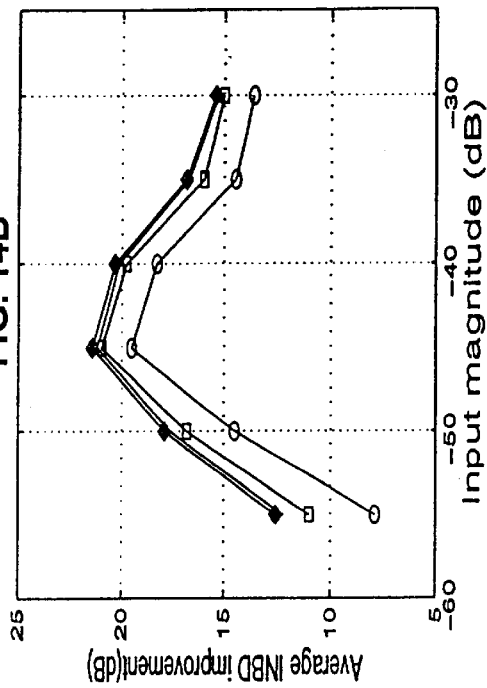
FIG. 14 shows plots of average (a) SNDR and (b) INBD improvements for the internal 9-level DAC (N=9, k=1), and (c) SNDR and (d) INBD improvements for the internal 8-level DAC(N=8, k=1) in accordance with the present invention.
Figure 14B:
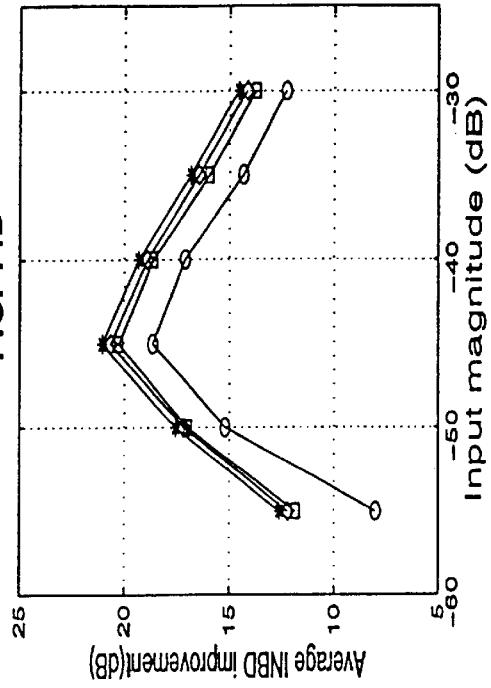

Monte Carlo simulation is used to analyze both component variation due to fabrication and also performance improvements resulting from utilization of the present invention. Histograms of SNDR and INBD improvements via the present invention are seen in FIG. 13(a) and FIG. 13(b), with one extra unit element in the 9-level DAC, a maximum random component mismatch of 0.5%, an input magnitude of −45 dB, an input frequency of fs/2048, and 1000 trials. In the simulation, the component mismatch errors are randomly selected in the range between 0% to 0.5%. In FIG. 14, SNDR and INBD improvements range from 0 dB to 30 dB, and SDM baseband tones are nearly eliminated for all trials. Maximum component mismatches from 0.5% to 2% are also simulated. Averaging 1000 trials, SNDR and INBD improvements up to 12 dB and 20 dB are shown in FIGS. 14(a) and 14(b), respectively, with SDM input magnitudes between −55 dB and −30 dB.

Figure 13C:
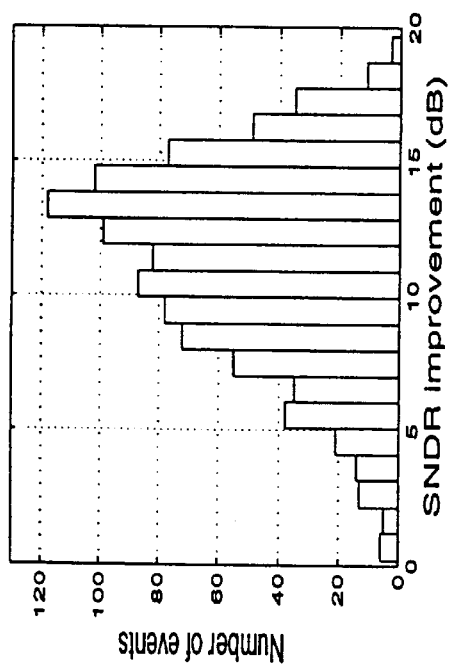
Figure 13D:
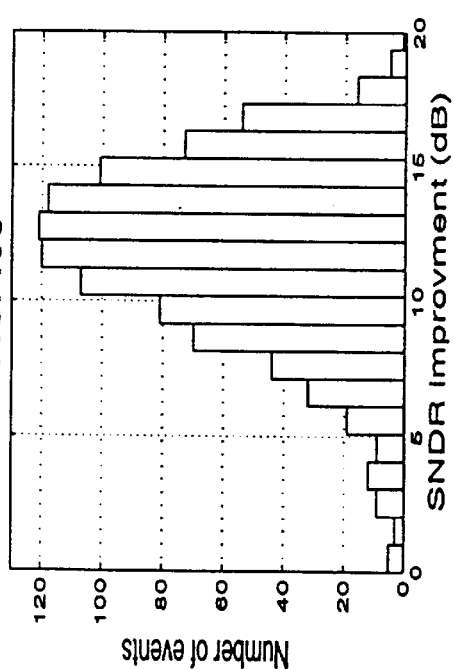
Figure 14C:
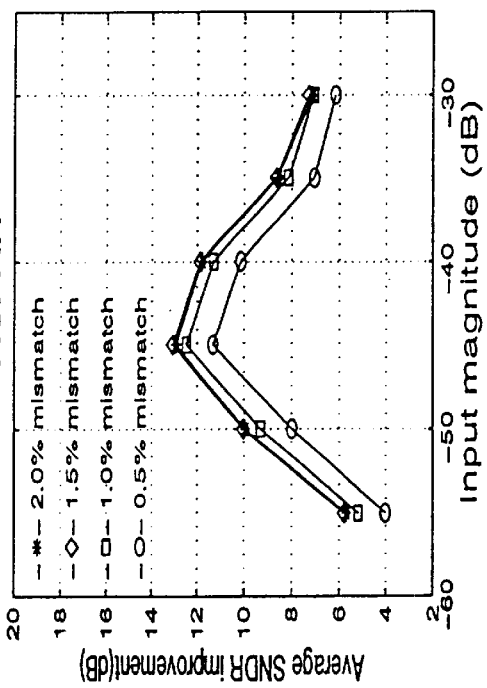
Figure 14D:
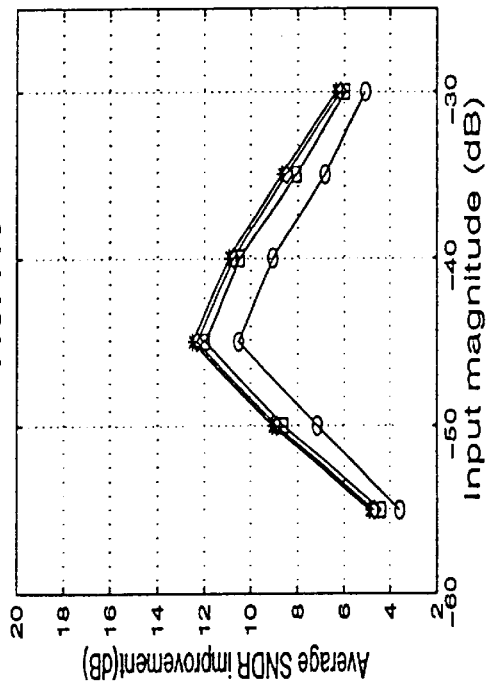

With one extra unit element in an 8-level DAC, histograms of SNDR and INBD improvements are shown in FIG. 13(c) and 13(d). Average SNDR and INBD improvements are up to 12 dB and 20 dB, as seen in FIG. 14(c) and 14(d), respectively.

Adding extra unit elements to different levels DACs for different SDM orders have also been simulated, confirming nearly perfect first-order DAC noise shaping with significant SNDR and INBD improvements and no notable SDM baseband tones, even at the higher levels of component variation.

Although the preferred embodiments of the invention have been described in detail, it should be understood that various alternations, modifications, and substitutions can be made therein without departing from the spirit an scope of the present invention as defined by the appended claims.

What is claimed is:

1. A sigma-delta modulator for use in an N-level sigma-delta analog-to-digital converter, N being an integer greater than two, which comprises:
    a loop filter adapted to receive a summed signal of an analog input signal of said N-level sigma-delta analog-to-digital converter and an analog feedback signal in negative sense for generating a filter signal;
    an N-level quantizer for quantizing said filter signal from said loop filter at frequency fs and providing a digital output code having a plurality of bits, wherein said digital output code is provided to a decimation filter from which an output word is provided as an output of said N-level sigma-delta analog-to-digital converter;
    an element selection logic coupled to said N-level quantizer for generating a set of control signals, $S_0$, $S_1$, $S_2$, ..., $S_{(N-2+k)}$, in response to said digital output code from said N-level quantizer, wherein k is a positive integer;
    an internal N-level digital-to-analog converter (DAC) coupled to said element selection logic containing (N−1+k) unit elements with component mismatches between said unit elements for providing said feedback signal to said loop filter in response to said digital output code from said N-level quantizer; wherein
    said element selection logic comprises
        a modulo-(N−1+k) adder having an input terminal for receiving said digital output code from said N-level quantizer and a second pointer (PTR2), and an output terminal for providing a first pointer (PTR1), wherein the first pointer (PTR1) is a sum (t) of said digital output code and PTR2, and is equal to a residual value of t dividing by (N−1+k) if t is greater than (N−2+k);
        an accumulator register coupled to said modulo-(N−1+k) adder having an input terminal for receiving said PTR1 and an output terminal for providing said PTR2, said accumulator register latching said PTR1 for a duration of one sampling period; and
        a control signal generator which receives said PTR1 and PTR2 and generates said set of (N−1+k) control signals, $S_0$, $S_1$, $S_2$, ..., $S_{(N-2+k)}$, wherein
            if (PTR1−1) modulo (N−1+k), r, is greater than PTR2, $S_{PTR2}$, $S_{(PTR2+1)}$, ..., $S_r$ are 1 and the others are 0,
            if (PTR1−1) modulo (N−1+k), r, is less than PTR2, $S_{PTR2}$, $S_{(PTR2+1)}$, ..., $S_{(N-2+k)}$, $S_0$, $S_1$, ..., $S_r$ are 1 and the others are 0, and
            if PTR1 is equal to PTR2, all the (N−1+k) control signals, $S_0$, $S_1$, $S_2$, ..., $S_{(N-2+k)}$ are 0; and
    said N-level digital-to-analog converter (DAC) further comprises a switch network for selectively connecting said (N−1+k) unit elements to a reference level or an analog ground terminal according to said set of (N−1+k) control signals, wherein an unit element is connected to said reference level when a corresponding control signal is 1, and to said analog ground terminal when said corresponding control signal is 0.

2. The sigma-delta modulator of claim 1, wherein k is one.

3. The sigma-delta modulator of claim 1, wherein said loop filter comprises cascaded analog integrator stages.

4. The sigma-delta modulator of claim 3, wherein said cascaded analog integrator stages could be realized in either discrete-time or continuous-time circuits.

5. An m-bit sigma-delta digital-to-analog converter, m being an integer greater than two, which comprises:
    an interpolation filter having an input for receiving a digital word with a plurality of bits, sampled at a Nyquist-rate frequency, and an output for providing an interpolated digital word, sampled at a frequency which is higher than said Nyquist-rate frequency;
    a digital sigma-delta modulator containing a digital loop filter and an m-bit truncator, which receives said interpolated digital word from said interpolation filter and provides an m-bit truncated digital word, and wherein said digital loop filter receives a summed signal of said interpolated digital word and a truncated digital output in a negative feedback sense from said truncator and generates a pre-processed signal, and said truncator truncates said pre-processed signal to provide said m-bit truncated digital word;

an element selection logic coupled to said digital sigma-delta modulator for generating a set of control signals, $S_0, S_1, S_2, \ldots, S_{(2_m-2+k)}$, in response to said truncated m-bit digital word from said digital sigma-delta delta modulator wherein k is a positive integer;

an m-bit digital-to-analog converter (DAC) coupled to said element selection logic containing $(2^m-1+k)$ unit elements with component mismatches between said unit elements for providing an analog signal to a post analog filter in response to said m-bit truncated digital word from said digital sigma-delta modulator; wherein said element selection logic comprises a modulo-$(2^m-1+k)$ adder having an input terminal for receiving said m-bit truncated digital word from said digital sigma-delta modulator and a second pointer (PTR2), and an output terminal for providing a first pointer (PTR1), wherein the first pointer (PTR1) is a sum (t) of said m-bit truncated digital word and PTR2, and is equal to a residual value of t divided by $(2^m-1+k)$ if t is greater than $(2^m-2+k)$;

an accumulator register coupled to said modulo-$(2^m-1+k)$ adder having an input terminal for receiving said PTR1 and an output terminal for providing said PTR2, said accumulator register latching said PTR1 for a duration of one sampling period; and a control signal generator which receives said PTR1 and PTR2 and generates said set of $(2^m-1+k)$ control signals, $S_0, S_1, S_2, \ldots, S_{(2_m-2+k)}$, wherein if (PTR1−1) modulo $(2^m-1+k)$, r, is greater than PTR2, $S_{PTR2}, S_{(PTR2+1)}, \ldots, S_r$ are 1 and the others are 0, if (PTR1−1) modulo $(2^m-1+k)$, r, is less than PTR2, $S_{PTR2}, S_{(PTR2+1)}, \ldots, S_{(2_m-2+k)}, S_0, S_1, \ldots, S_r$ are 1 and the others are 0, and if PTR1 is equal to PTR2, all the (N−1+k) control signals, $S_0, S_1, S_2, \ldots, S_{(2_m-2+k)}$ are 0; and said m-bit digital-to-analog converter (DAC) further comprises a switch network for selectively connecting said $(2^m-1+k)$ unit elements to a reference level or an analog ground terminal according to said set of $(2^m-1+k)$ control signals, wherein an unit element is connected to said reference level when a corresponding control signal is 1, and to said analog ground terminal when said corresponding control signal is 0.

6. The m-bit sigma-delta digital-to-analog converter of claim 5, wherein k is one.

* * * * *